(12) United States Patent
Teramoto

(10) Patent No.: US 6,480,053 B1
(45) Date of Patent: Nov. 12, 2002

(54) SEMICONDUCTOR DEVICE HAVING AN INTERNAL POWER SUPPLY CIRCUIT

(75) Inventor: Kazuhiro Teramoto, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/587,474

(22) Filed: Jun. 5, 2000

(30) Foreign Application Priority Data

Jun. 7, 1999 (JP) .............................. 11-160278

(51) Int. Cl.[7] .............................................. H03K 17/735
(52) U.S. Cl. ...................... 327/408; 327/541; 323/316
(58) Field of Search ................................ 327/538, 540, 327/541, 543, 99, 408; 323/316, 313

(56) References Cited

U.S. PATENT DOCUMENTS

| 4,706,013 A | * 11/1987 | Kuo .............................. 323/316 |
| 4,763,021 A | * 8/1988 | Stickel .......................... 327/541 |
| 4,864,216 A | * 9/1989 | Kalata et al. ................ 323/315 |
| 5,317,254 A | * 5/1994 | Olson ............................ 323/316 |
| 5,455,534 A | * 10/1995 | Motegi et al. ................ 327/544 |
| 5,689,460 A | * 11/1997 | Ooishi ........................... 327/538 |

FOREIGN PATENT DOCUMENTS

| JP | 4-15949 | 1/1992 |
| JP | 7-105160 | 11/1995 |
| JP | 9-145804 | 6/1997 |
| JP | 9-153300 | 6/1997 |
| JP | 11-053894 | 2/1999 |
| KR | 94-24986 | 11/1994 |
| KR | 1998-018101 | 6/1998 |

* cited by examiner

*Primary Examiner*—Terry D. Cunningham
(74) *Attorney, Agent, or Firm*—Dickstein, Shapiro, Morin & Oshinsky, LLP.

(57) ABSTRACT

A plurality of the P-channel transistors of Group A and a plurality of P-channel transistors of Group B are connected between the power-supply-voltage VCC and the ground, and an output signal SUBUP is obtained from the node C via two inverters. Each terminal of. Transistors of Group B is connected to the ground via N-channel first, second and third transistors. The first signals $\phi1$ and $\phi2$ are inputted to the gates of the first and second transistors and the output of the NOR logical circuit is inputted to the gate of the third transistor. Current performance of the P-channel transistors of Group B is adjusted to control the substrate voltage and to make the substrate voltage both higher and lower than that of normal operation by the use of the test modes. So, the substrate voltage can be changed during hold tests in a selection process to accelerate the tests and shorten the selection time.

4 Claims, 4 Drawing Sheets

SEMICONDUCTOR DEVICE HAVING AN INTERNAL POWER SUPPLY CIRCUIT

BACKGROUND OF THE INVENTION

1. Field of the Invention

This invention relates to a semiconductor device having an internal power supply circuit, which can change an internal-power-supply-voltage.

2. Description of the Related Art

A substrate voltage detecting circuit is used especially to supply a stationary and stable substrate voltage to a cell array portion of a dynamic memory having a triple well.

In general, such substrate voltage detecting circuit is used only to detect a certain voltage. However, increasing miniaturization and integration of semiconductor devices in recent years have resulted in a drastically longer time for conducting tests. Accordingly, for the purpose of ensuring productivity, it is necessary to shorten such test time. To achieve this object, it is necessary to implement accelerated tests by increasing the internal voltage.

In Japanese Laid-open Public Hei 4-15949, a voltage conversion circuit comprising a reference voltage generating means for generating a plurality of reference voltages at different levels out of an externally supplied power supply voltage, a selection means for selecting one of said plurality of reference voltages in response to an externally given control signal and an outputting means for supplying the selected reference voltage to said internal circuit.

However, the above-mentioned prior art is designed to feed the power supply voltage from outside, and generate a plurality of reference voltages out of it and select one. A technique that can change the internal-power-supply-voltage by test modes in the semiconductor device having an internal power supply circuit has not been proposed yet.

SUMMARY OF THE INVENTION

The object of the present invention is to provide a semiconductor device having an internal power supply circuit that can change an internal-power-supply-voltage so that an accelerated test can be implemented effectively.

A semiconductor device having an internal power supply circuit according to the present invention, comprises: a substrate voltage detecting circuit which detects a substrate voltage of the semiconductor device having an internal power supply circuit and outputs the first level signal when the substrate voltage exceeds a reference voltage; a control circuit which lowers said substrate voltage when the output signal of the substrate voltage detecting circuit is switched to said first level; and a voltage setting circuit which inputs the first signal indicating a test mode and sets said reference voltage of said substrate voltage detecting circuit either lower or higher than that of normal operation.

This semiconductor device has a substrate voltage control circuit that inputs the second signal indicating a test mode and increases said substrate voltage, and the substrate voltage control circuit comprises a flip flop circuit that inputs said second signal, an output signal of said substrate voltage detecting circuit and a signal initializing a contact voltage when the voltage is supplied, a voltage conversion circuit that converts the voltage of the output signal given by the flip flop circuit, a resistance connected between said substrate and the ground, and transistors that are connected in series to said resistance and input the output of said voltage conversion circuit to the gates thereof, and is constituted so that in receiving said second signal, said flip flop circuit may be set, and in receiving the output signal of said substrate voltage detecting circuit, said flip flop circuit may be reset, enabling the substrate voltage to increase.

A semiconductor device having an internal power supply circuit according to the other aspect of the present invention comprises: a reference voltage generation circuit which generates a plurality of output signals of reference voltage; a selection circuit which makes a selection of said output signals in accordance with the first signals indicating a test mode; a voltage comparison circuit which compares the output signals of said selection circuit and the internal-power-supply-voltage; and an internal power supply control circuit which controls said internal-power-supply-voltage to the reference voltage in accordance with the comparison results given by the voltage comparison circuit.

In the case where the semiconductor device having this internal power supply circuit has a transistor that is connected between said internal-power-supply-voltage and the ground, and that inputs the second signals indicating a test mode via the gates thereof, and said test mode lowers the internal-power-supply-voltage, said second signals go high for a fixed period of time and cause said transistors to turn on for a fixed period of time and accordingly, the internal-power-supply-voltage to be able to be effectively lowered.

As explained above, since the present invention can change the internal-power-supply-voltage through the use of the first or second signals and set a substrate voltage or the internal-power-supply-voltage at a plurality of voltage, acceleration of tests can be effectively be realized.

DETAILED DESCRIPTION OF THE PREFERRED EMBODIMENTS

Figure 1:
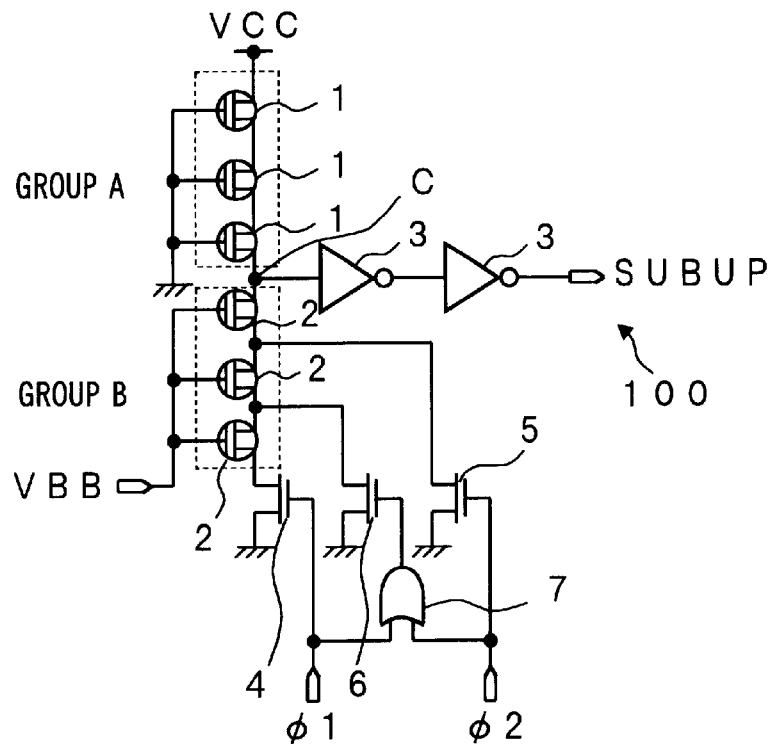
FIG. 1 is a circuit diagram showing a substrate voltage detecting circuit of the semiconductor device having an internal power supply circuit, relating to the first embodiment of the present invention.
Figure 2:
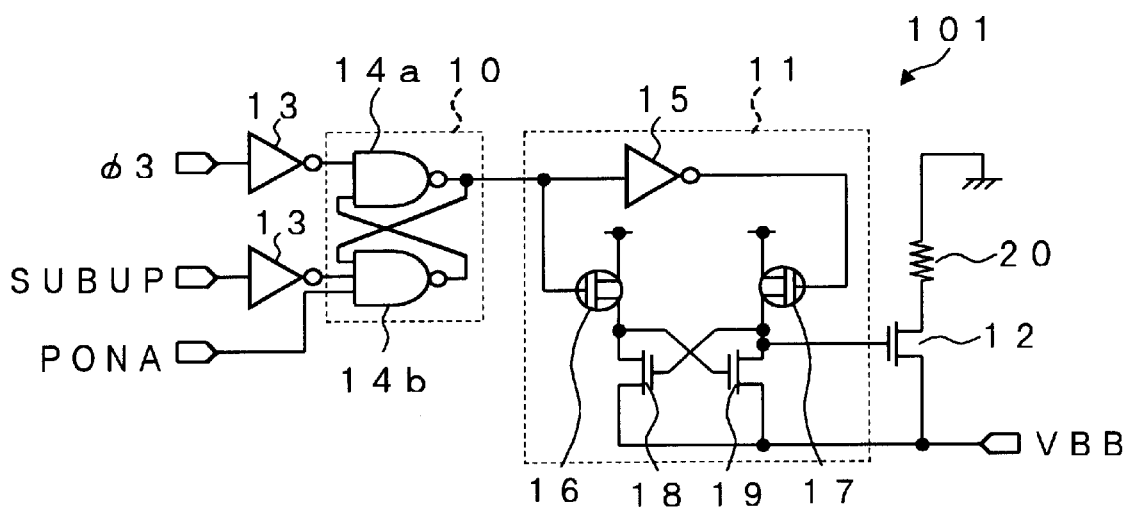
FIG. 2 is a circuit diagram showing the substrate voltage control circuit of the above device.

The following explanation is given with reference to the attached drawings for the embodiments of the invention. FIGS. 1 and 2 illustrate a semiconductor device having an internal power supply circuit of the present invention and FIG. 1 shows a substrate voltage detecting circuit 100 and FIG. 2 shows a substrate voltage control circuit 101, respectively.

The substrate voltage detecting circuit 100 shown in FIG. 1 comprises a plurality (three in the drawing) of P-channel transistors 1 of Group A, to whose gate a GND level is given, and a plurality (three in the drawing) of P-channel transistors 2 of Group B, to whose gate a substrate voltage VBB is given, and a plurality (two in the drawing) of inverters 3. The inverter 3 at the last stage gives an output signal SUBUP. While the P-channel transistors 1 are connected in series between the voltage supply VCC and the node C, the P-channel transistors 2 are connected in series between the node C and the N-channel transistor 4. The inverters 3 are connected in series between the node C and the output terminal of the output signal SUBUP.

The N-channel transistor 4 is connected between the ground and the P-channel transistor 2 that is located closest to the ground, and a signal $\phi1$ (the first signal) is inputted to the gate of the N-channel transistor 4. The N-channel transistor 5 is connected between the node that is located between the P-channel transistor 2 closest to the node C and the P-channel transistor 2 at the next stage, out of the P-channel transistors 2 of Group B, and the ground, and a signal $\phi2$ (the first signal) is inputted to the gate of the N-channel transistor 5. Further, the N-channel transistor 6 is connected between the node located between the P-channel transistor 2 closest to the ground side and the P-channel transistor 2 at the next stage, out of the P-channel transistors 2 of Group B, and the ground, and an output signal of the NOR circuit 7 which conducts NOR logical operation of the signals $\phi1$ and $\phi2$ is inputted to the gate of the N-channel transistor 6.

The output terminal (not shown) of the output signal SUBUP is connected to a control circuit that lowers a substrate voltage, and when the SUBUP signal is at an H level, the control circuit that lowers a substrate voltage is powered and lowers a substrate voltage.

The gate voltage determines the amount of electric current passing through the P-channel transistors 1 and 2, of Groups A and B, shown in FIG. 1. The changes in the substrate voltage affect the current performance of the P-channel transistors 2 of Group B and accordingly the voltage of the node C changes. When the voltage-changes at the node C are detected, the signal SUBUP that controls the substrate voltage is generated. More specifically, when the substrate voltage goes up, the current performance of the P-channel transistors 2 of Group B goes down and the voltage at the node C goes up. In contrast with this, when the substrate voltage goes down, the current performance of the P-channel transistors 2 of Group B goes up and the voltage at the node C goes down. As described above, balance between the P-channel transistors 1 and 2, of Groups A and B determines the voltage at the node C.

The voltage at the node C is outputted as the detection signal SUBUP through the inverter 3 at the next stage. More specifically, when the substrate voltage exceeds a desired voltage, the P-channel transistors 1 and 2, of Groups A and B adjust themselves in size so that the output signal, SUBUP, may change from an L output to an H output.

The output signals, SUBUP, are input to the control circuit that lowers the substrate voltage, and when SUBUP changes to an H level, this control circuit is powered and lowers the substrate voltage to a desired voltage.

On the other hand, the N-channel transistors from 4 to 7, which characterize the present invention, have a function of changing the substrate voltage where the current performance of the P-channel transistors 1 and 2, of Groups B and A is balanced, by modifying the effective number of the P-channel transistors 2 of Group B. Thus, the substrate voltage can be altered when the output signal, SUBUP, changes from an L output to an H output.

However, when such changes are made, in some cases a desired voltage may be higher than the substrate voltage that once became stable to be low. Therefore, the substrate voltage control circuit 101 is furnished.

The substrate voltage control circuit 101 is used to increase the substrate voltage by design. This substrate voltage control circuit 101 comprises a flip flop circuit 10 that inputs a test mode input signal $\phi3$, a substrate voltage detecting signal SUBUP that detects the above-mentioned substrate voltage, and a signal PONA that initializes a contact voltage at the time of voltage supply, a voltage conversion circuit 11 that converts a voltage of the output signal of the flip flop circuit 10. The flip flop circuit 10 includes a 2 input NAND circuit 14a and 3 input NAND circuit 14b, and at the input terminals which is one of 2 input NAND circuit 14a, which is one of the NAND circuits of the flip flop circuit 10,the second signal $\phi3$ indicating a test mode is inputted via an inverter 13 and at the other input terminal thereof the output of the other circuit, 3 input NAND circuit 14b is inputted. Further, to 3 input NAND circuit 14b, which is the other circuit of NAND circuits, the output signal SUBUP of the substrate voltage detecting circuit 100 is inputted via the inverter 13 and at the other two input terminals of 3 input NAND circuit 14b the output of 2 input NAND circuit 14a and the signal PONA are inputted. The voltage conversion circuit 11 comprises an inverter 15, P-channel transistors 16 and 17, and N-channel transistors 18 and 19.

For the purpose of increasing the substrate voltage, the substrate is connected to GND via the resistance 20 and the N-channel transistor 12 and the gate of the N-channel transistor 12 is connected to the flip flop circuit 10 via the voltage conversion circuit 11.

The input signal $\phi3$ is given so that this control circuit may be powered only when entering a test mode that makes a preset value of the substrate voltage exceed a voltage of normal operation.

Figure 3:
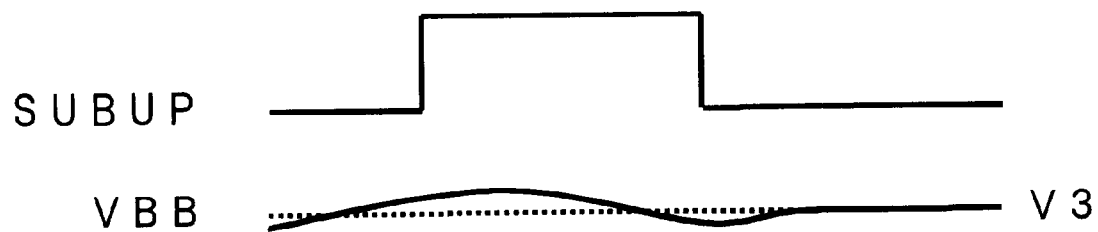
FIG. 3 is a timing chart showing the operation of said substrate voltage detecting circuit.

Next, an explanation will be given as to the operation of the semiconductor device in the embodiment, whose constitution is above-mentioned. First, the operation of the substrate voltage detecting circuit 100 will be explained with reference to the timing chart of FIG. 3. At the time of normal operation, all the input signals, $\phi1$ and $\phi2$, inputted to the gates of the N-channel transistors N1 and N2 are at an L-level. Since the output of the NOR logical circuit 7 of the input signals $\phi1$ and $\phi2$ as gate signals are inputted to the N-channel transistor 6, nothing but the transistor 6 is on in this situation. In this case, the electric current passing through the P-channel transistor 1 of Group A goes to the GND through the two P-channel transistors 2 and the N-channel transistor 6.

When the substrate voltage VBB is lower than the desired voltage V3, the current performance of the P-channel transistors 1 of Group A is larger than that of the P-channel transistors 2 of Group B, and the node C has a lower voltage than a threshold of the inverter 3 at the next stage and accordingly, the output signal SUBUP is at an L level. When the substrate voltage exceeds V3, the current performance of the P-channel transistors 2 of Group B becomes below that of the P-channel transistors 1 of Group A and as a result, the voltage at the node C goes up and exceeds the threshold of the inverter 3 at the next stage, changing the output signal SUBUP to an H level and operating the control circuit that makes the substrate voltage as low as the desired voltage. When this control circuit makes the substrate voltage as low as the desired voltage V3, the voltage at the node C goes down below the threshold of the inverter 3 at the next stage, changing the output signal SUBUP to an L level and susupending the control circuit.

Figure 4:
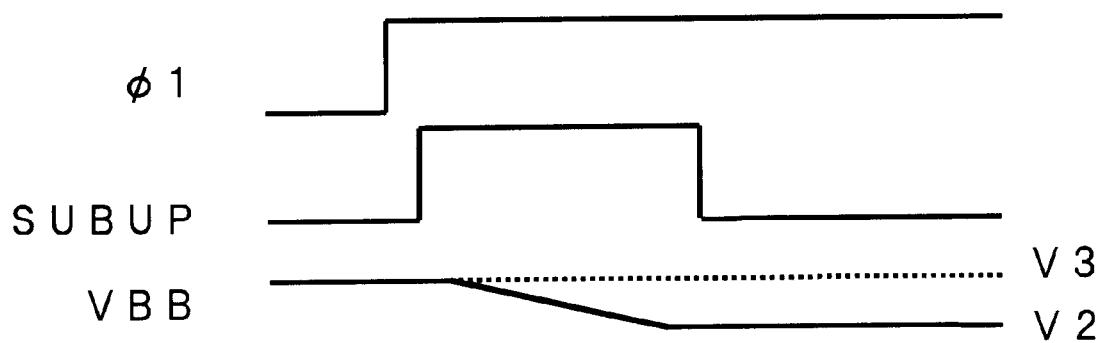
FIG. 4 is a timing chart showing the operation of the circuit when a substrate voltage is set low.

Next, the operation when the substrate voltage is set low will be explained with reference to the timing chart of FIG. 4.

When entering the test mode 1, the signal φ1 is changed to an H level, turning on the transistor 4 and turning off the transistors 5 and 6. In this case, the electric current passing through the P-channel transistors 1 of Group A goes to the GND via three P-channel transistors 2 of Group B and the N-channel transistor 4. More specifically, since the number of the P-channel transistors 2, located between the node C and GND, increases, the current performance between the node C and GND is lowered and the node C becomes stable at a voltage higher than that of normal operation. Therefore, the output signal SUBUP outputs at an H level when the substrate voltage is at V3 at the time of normal operation, the substrate voltage control circuit is in motion and the substrate voltage becomes lower than that of normal operation. When the substrate voltage is reduced to V2, the node C has a voltage that becomes below the threshold of the inverter 3 at the next stage, and the output signal SUBUP is changed to an L level, suspending the substrate voltage control circuit. Consequently the substrate voltage becomes stable at V2, lower than that of normal operation V3.

Figure 5:
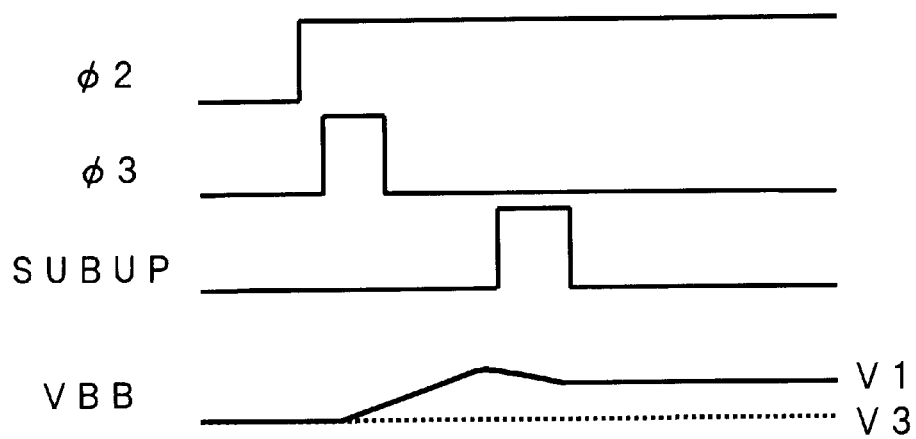
FIG. 5 is a timing chart showing the operation of the circuit when a substrate voltage is set high.

Next, the operation when the substrate voltage is set higher than that of normal operation will be explained with reference to the timing chart of FIG. 5. When entering the test mode 2, the input signal φ2 is changed to an H level, turning on the transistor 5 and turning off the transistors 4 and 6. In this case, the electric current passing through Group A goes to GND via one P-channel transistor 2 of Group B and the N-channel transistor 5. Then, the current performance of the P-channel transistors 2 of Group B exceeds that of normal operation and so, the node C becomes stable at a voltage lower than that of normal operation. Consequently, a reference voltage, which changes the output signal SUBUP to an H level, becomes V2 higher than that of normal operation.

In addition to the above, when entering the test mode 2, the signal φ3 is produced from the signal φ2. This signal φ3 is a signal that sets the control circuit, shown in FIG. 2, which increases the substrate voltage. The signal φ3 sets the flip flop circuit 10 and turns on the N-channel transistor 12 connecting between GND and the substrate voltage VBB via the resistance 20. Thus, the electric current passes from GND to the substrate voltage and the substrate voltage exceeds the substrate voltage V3 at normal operation. When the substrate voltage reaches a desired voltage V1, the substrate voltage detecting circuit 100 inputs a SUBUP signal. The signal resets the RS flip flop circuit 10 and turns off the N-channel transistor 12, stopping the flow of the electric current into the substrate voltage. At this time, in connection with the sensitivity of the circuit, in some cases, the substrate voltage may exceed the desired voltage V1, but by the signal SUBUP the control circuit that lowers the substrate voltage operates, the substrate voltage being stable at the desired voltage V1.

As mentioned above, the substrate voltage can be made either higher or lower than that of normal operation through the use of the test modes, and so by changing the substrate voltage when hold tests in a selection process are conducted, the tests can be accelerated and selection time can be shorted.

Next, the second embodiment of the present invention will be explained with reference to FIG. 6. In the above-mentioned first embodiment, the test-mode-based signals are input to the substrate voltage detecting circuit and the substrate voltage is changed by the use of the test modes, but it is also possible to realize the test-mode-based changes of the internal-power-supply-voltage by the use of the reference voltage generating circuit having the other internal power supply circuit.

Figure 6:
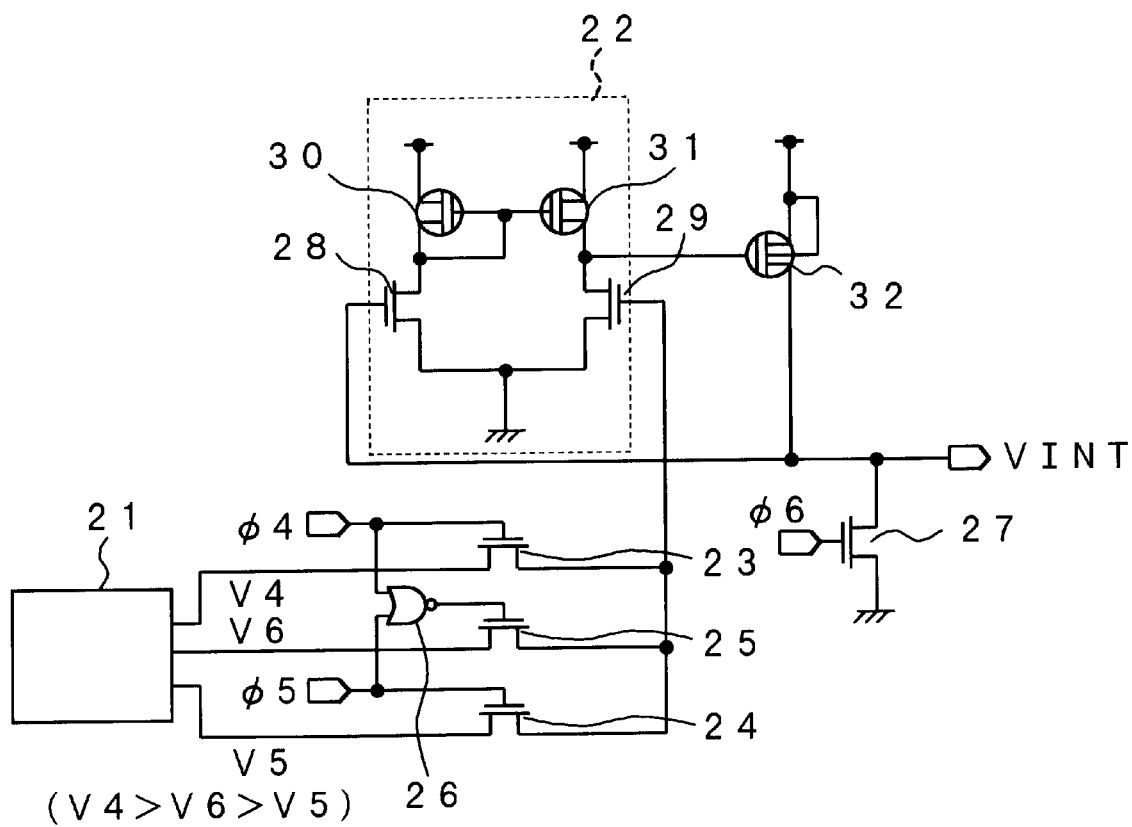
FIG. 6 is a circuit diagram showing the semiconductor device having an internal power supply circuit, relating to the second embodiment of the present invention.

The reference voltage generating circuit 21 shown in FIG. 6 generates three different reference voltages, V4, V5 and V6 (V4>V6>V5).

These different reference voltages, V4, V5, and V6 are input to the voltage comparison circuit 22, which compares the voltage with the internal-power-supply-voltage VINT, via a selection circuit comprised of the N-channel transistors 23, 24 and 25, respectively, which respectively receive as inputs the input signals φ4 and φ5 and the output signal of the NOR logical circuit 26 via their gates. The voltage comparison circuit 22 includes the P-channel transistors 30 and 31 and the N-channel transistors 28 and 29 that are connected between the voltage supply and the ground voltage, and their output signals are input to the gate of the P-channel transistor 32, connected between the voltage supply and the internal-power-supply-voltage VINT and the ground is connected N-channel transistor 27. A signal φ6 indicating a second test mode is inputted to the gate of this transistor.

Next, the operation of the second embodiment will be explained. The input signals φ4 and φ5 are at an L level at the time of normal operation and the transistor 25 that receives the output of the NOR logical circuit 26 as an input signal is on and the voltage comparison circuit 22 controls the internal-power-supply-voltage VINT, by comparing the reference voltage V6 and the internal-power-supply-voltage VINT.

Figure 7:
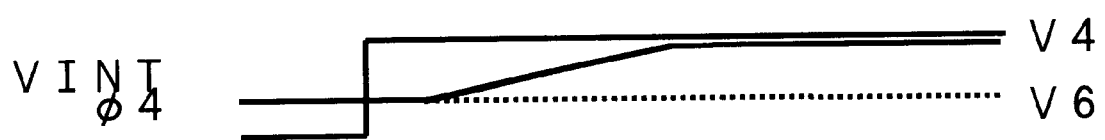
FIG. 7 is a timing chart showing the operation of said circuit when an internal power-supply-voltage is set high.

When entering the test mode 3, the input signal φ4 is changed to an H level, shown in FIG. 7. This turns on the N-channel transistor 23 and turns off the N-channel transistors 24 and 25. Thus, the internal-power-supply-voltage is compared with the reference voltage V4, which is higher than that of normal operation. As a result, the internal-power-supply-voltage rises to the value V4 and is kept stable at this level.

Figure 8:
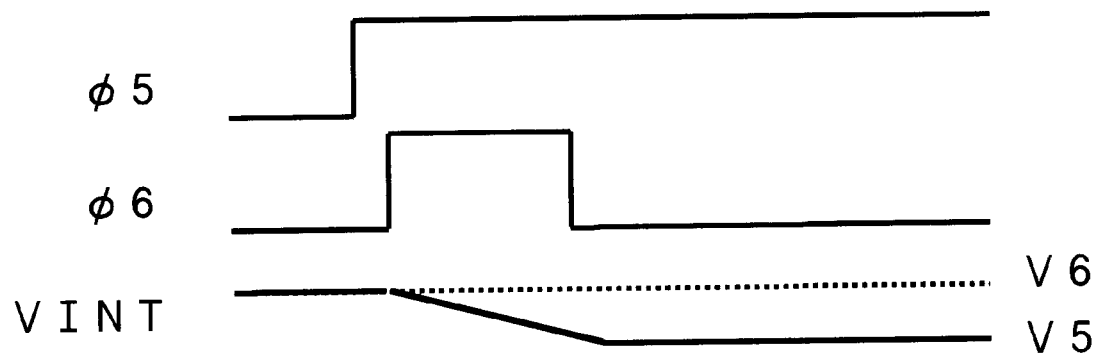
FIG. 8 is a timing chart showing the operation of said circuit when an internal-power-supply-voltage is set low.

When entering the test mode 4, the input signal φ5 is changed to an H level, shown in FIG. 8. This turns on the N-channel transistor 24 and off the N-channel transistors 23 and 25. Thus, the internal-power-supply-voltage is compared with the reference voltage V5, which is lower than that of normal operation.

To adjust VINT to the lower level of V5, when entering the test mode 4 the signal φ6 receives the signal φ5 and is temporarily changed to an H level. The input signal φ6 is input to the gate of the N-channel transistor 27 and when the input signal φ6 is changed to an H level, it turns on the N-channel transistor 27. This allows internal-power-supply-voltage VINT to fall to the value V5. It is, of course, necessary to set the circuit so that the input signal φ6 may remain at an H level long enough for the internal-power-supply-voltage VINT to be lowered from the voltage V6 at normal operation, to the desired voltage V5.

Accordingly, the test modes can carry out the operation to change the internal-power-supply-voltage.

In addition, since it is the internal power supply that is to be changed in this embodiment, the present invention also makes it possible to conduct bump tests that changes voltage during the tests other than the acceleration of the tests by the internal power supply.

As explained above in detail, according to the present invention, the test modes can be used to make the substrate voltage both higher and lower than that of normal operation, and accordingly when hold tests are conducted during a selection process, changing the substrate voltage can lead to acceleration of the tests and cut-down of the selection time.

What is claimed is:

1. A semiconductor device comprising:

an internal power supply output;

a reference voltage generation circuit that provides reference voltages at outputs thereof corresponding to normal and test mode operations for the semiconductor device;

a voltage comparison circuit;

a selection circuit connected to the outputs of the reference voltage generating circuit, and operative in response to a first control signal to output one of the reference voltages to a first input of the comparison circuit;

a second input to the comparison circuit connected to the internal power supply output;

an internal power supply control circuit connected to the voltage comparison circuit and operative to adjust and maintain the internal power supply output at a voltage corresponding to the selected reference voltage; and a transistor connected between said internal power supply and the ground and to a gate of which a second signal indicating a test mode is inputted, wherein if said test mode indicates to lower the internal power supply voltage, said second signal goes high for a fixed period of time and turns on said transistor for a fixed period of time.

2. A semiconductor device according to claim 1, wherein said selection circuit is comprised of transistors that are connected respectively between the first and second outputs of said reference voltage generation circuit and said voltage comparison circuit and to gates of which the first signal indicating said test mode is inputted.

3. A semiconductor device comprising:

an internal power supply output;

a reference voltage generation circuit that provides reference voltages at outputs thereof corresponding to normal and test mode operations for the semiconductor device;

a voltage comparison circuit;

a selection circuit connected to the outputs of the reference voltage generating circuit, and operative in response to a first control signal to output one of the reference voltages to a first input of the comparison circuit;

a second input to the comparison circuit connected to the internal power supply output;

an internal power supply control circuit connected to the voltage comparison circuit and operative to adjust and maintain the internal power supply output at a voltage corresponding to the selected reference voltage;

the reference voltage generating circuit provides a first output representing the normal operating voltage, a second output representing a first test mode voltage which is greater than the normal operating voltage, and a third output representing a second test mode voltage which is less than the normal operating voltage; and the selection circuit is comprised of first, second and third transistors having:

signal paths connected respectively to the first, second and third outputs of the reference voltage generating circuit, and in common to the first input of the comparison circuit; and control inputs provided by the first control signal, and by a second control signal corresponding to the second test mode, the first, second and third transistors being responsive to the value of the first and second control signals to pass the first, second or third reference voltage to the comparison circuit; the device further comprising:

a further transistor having its signal path connected between the internal power supply and ground and a control input provided by a third control signal, a value of which indicates if the semiconductor device is to operate in the second test mode; the further transistor being responsive only to the value of the third control signal indicating operation in the second test mode to permit current flow through the signal path thereof.

4. A semiconductor device according to claim 3, wherein: the third control signal is maintained at the value of the second control signal for a predetermined period commencing at the start of operation in the second test mode.

* * * * *